United States Patent [19]

Long

[11] 4,114,093

[45] Sep. 12, 1978

[54] NETWORK TESTING METHOD AND APPARATUS

[75] Inventor: Lewis Frank Long, Alta Loma, Calif.

[73] Assignee: Everett/Charles, Inc., Pomona, Calif.

[21] Appl. No.: 751,989

[22] Filed: Dec. 17, 1976

[51] Int. Cl.² ........................................... G01R 15/12
[52] U.S. Cl. ............................. 324/73 AT; 235/304; 324/51
[58] Field of Search ............... 324/73 AT, 73 R, 51; 235/153 AC

[56] References Cited

U.S. PATENT DOCUMENTS

| | | | |
|---|---|---|---|
| 3,370,232 | 2/1968 | Wickersham | 324/73 R |
| 3,441,849 | 4/1969 | Bennett et al. | 324/73 R |
| 3,492,571 | 1/1970 | Desler | 324/73 R |
| 3,528,104 | 9/1970 | Ehlschlager | 324/51 |
| 3,535,633 | 10/1970 | Fallon | 324/73 R |
| 3,665,299 | 5/1972 | Yarbrough | 324/51 |
| 3,784,910 | 1/1974 | Sylvan | 324/73 AT |

Primary Examiner—Rudolph V. Rolinec
Assistant Examiner—Vincent J. Sunderdick
Attorney, Agent, or Firm—Christie, Parker & Hale

[57] ABSTRACT

The present invention provides method and apparatus for testing a network, such as a printed circuit board, to check whether it conforms to its design as to having a plurality of network nodes and a predetermined node-connection pattern defining a division of the network nodes into a plurality of groups. In a conforming network, each network node is connected in common to all other network nodes in its group, and is isolated from the network nodes in each other group. In accordance with the invention, one of the network nodes is selected to serve initially as a present FROM node. There is thereafter selected repeatedly, from the network nodes that have not previously served as a present FROM node, a network node to serve temporarily as a present FROM node. Each time a network node is selected to serve as a present FROM node, there is selected a network node, from the group containing the present FROM node, to serve temporarily as a present TO node such that, as to each group, network nodes thereof are sequentially selected to serve as TO nodes in the same order that they are sequentially selected to serve as FROM nodes. Each time two different nodes are selected as present FROM and TO nodes, continuity therebetween is verified.

11 Claims, 7 Drawing Figures

NETWORK TESTING METHOD AND APPARATUS

BACKGROUND OF THE INVENTION

This invention relates to the art of testing networks, such as printed circuit boards, to verify that network nodes of the network are interconnected in accordance with the design of the network.

Manual continuity-testing of a network, whether it be a wiring harness, a hard-wired component board, or a printed circuit board, is laborious and time consuming for any network of moderate complexity. In recognition of the drawbacks of such manual testing, there have heretofore been proposed a number of automated testing systems based on a variety of different techniques.

A significant drawback involved in some of the prior art techniques is that redundant checking occurs. In particular, one prior art technique employs seriatim steps such that each network node is individually tested against every other network node. The number of such seriatim steps necessary to check out a network is a factorial function of the number of network nodes. Thus, an enormous number of seriatim steps are involved in testing a network of moderate complexity. For a test of a printed circuit board having, for example, 1000 network nodes, many minutes are required to complete all the seriatim steps even though a very high clock rate is used to control the stepping operation.

Separate and also significant drawbacks are involved in other prior art techniques. In particular, one prior art technique employs simultaneous parallel testing steps. In order to do this it is necessary to provide separate, parallel-operating test units, and this involves considerable complexity and attendant expense. Other prior art techniques employ bulk-shorting methods in conducting the continuity-verification testing. In bulk-shorting, a plurality of the network nodes are externally connected together by virtue of the operation of the testing apparatus. One of the problems that has arisen from using such bulk-shorting relates to the difficulty of locating where a fault lies in a faulty network. To solve the problem created by the bulk-shorting technique involves additional testing time and further complex testing apparatus.

SUMMARY OF THE INVENTION

The present invention provides method and apparatus for testing a network, and has significant advantages as to the speed with which testing is accomplished and yet avoids the complexity and attendant high cost of high-speed prior art parallel techniques.

In practicing the method of this invention, steps are taken to check a network having a plurality of network nodes. When the network conforms to its design, it has a predetermined node connection pattern defining a division of the network nodes into a plurality of groups of network nodes, with each network node being connected in common to all the network nodes in its group and being isolated from the network nodes in each other group. In a first step, one of the network nodes is selected to serve initially as a present FROM node. There is thereafter selected repeatedly, from the network nodes that have not previously served as a present FROM node, a network node to serve temporarily as a present FROM node. Each time a network node is selected to serve as a present FROM node, there is selected a network node, from the group containing the present FROM node, to serve temporarily as a present TO node. According to an important feature of the invention, the selection of the TO nodes is such that, as to each group, network nodes thereof are sequentially selected to serve as TO nodes in the same order that they are sequentially selected to serve as FROM nodes. Each time two different network nodes are selected as present FROM and TO nodes respectively, continuity therebetween is verified.

As to apparatus embodying the invention, it comprises continuity verifying means and timing and control means. The continuity verifying means is conventionally arranged to have a first input node, a second input node, and means for providing a signal specifying whether continuity exists between the first and second input nodes. Certain terminology useful in defining the elements of the apparatus includes the terms "presently scanned node" and "presently verification-tested node" which have the same respective meanings as the terms present FROM node and present TO node used hereinabove. The first input node of the continuity verifying means is connectable to the presently scanned node, and the second input node thereof is connectable to the present verification-tested node. Thus, the signal provided by the continuity-verifying means specifies whether, in the network under test, the presently scanned note and the present verification-test node are in fact connected in common in conformity to the design calling for them to be in the same group.

The timing and control means provides for connecting the first and second input nodes to selected network nodes to verify that each network node is in fact connected in conformity to the design. It includes first selecting means for individually selecting network nodes in a group-independent scanning sequence defining an ordering of all the network nodes. Each network node at the time of its selection by the first selecting means then constitutes the presently scanned node. First switching means are provided for connecting the presently scanned node to the first input node. Inasmuch as the scanning sequence is group-independent, the first selecting means selects the network nodes one-by-one in an order defined by the first selecting means itself, and, accordingly, the structure and function of the first selecting means is simple. Preferably, it includes a register for scoring a first address, means for repeatedly indexing the first address, and means for causing the first switching means to connect a different network node to the first input node each time the first address is indexed.

An important element of the timing and control means is a second selecting means for individually selecting network nodes by reference to their order in a group-dependent sequence progressing such that, as to each group, network nodes thereof are sequentially selected by the second selecting means in the same order that they are sequentially selected by the first selecting means. Each network node at the time of its selection by the second selecting means constitutes the present verification-tested node. Second switching means are included in the timing and control means for connecting the presently verification-tested node to the second input node. Preferably, the second selecting means includes a table look-up memory having a plurality of addressable locations each having stored therein a respective one of a sequence of node selection signals. In operation, the table look-up memory is addressed in coordination with the scanning sequence, and in response, provides the sequence of node selection signals to control the second switching means. Other preferred and advantageous features of the invention will be better understood after referring to the detailed description below.

DETAILED DESCRIPTION

In a network testing apparatus embodying the preferred features of the invention, a test jig 10 (FIG. 2) is employed for connecting the apparatus of this invention to a circuit board for testing thereof. Suitable test jigs are well known in the art; a test jig merely provides a fixture for holding a circuit board and making electrical contact with selected points or network nodes on the board.

Advantageously, test jig 10 is constructed in accordance with the invention described and claimed in U.S. patent application entitled "PROBE ACTUATOR ASSEMBLY", Ser. No. 747,611, filed Feb. 3, 1977, By Everett J. Long and Elmer W. Muench, commonly assigned to the assignee of the present invention. The above-referenced application, now abandoned, is the parent of application Ser. No. 818,206, filed July 22, 1977.

Figure 2:
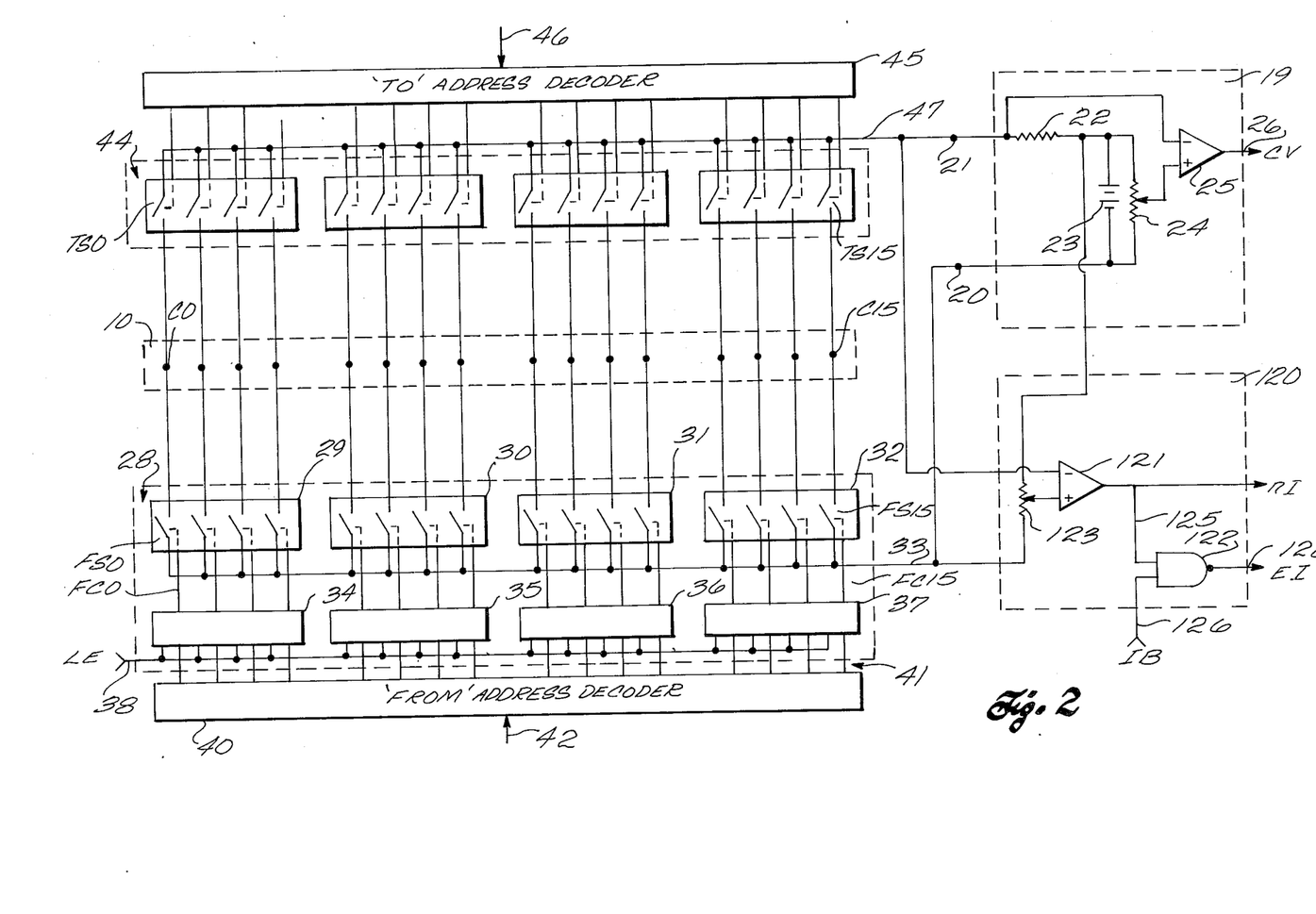
FIG. 2 is a block and schematic diagram depicting switching circuitry and verifying circuitry that, in combination with the circuitry of FIG. 1, forms an embodiment of the present invention.

Jig 10 for the illustrated embodiment has 16 contactors C0 through C15 for respectively effecting an electrical connection to up to 16 network nodes. Many more such contactors may be provided as necessary in an embodiment adapted for testing boards having many more network nodes.

Figure 3:
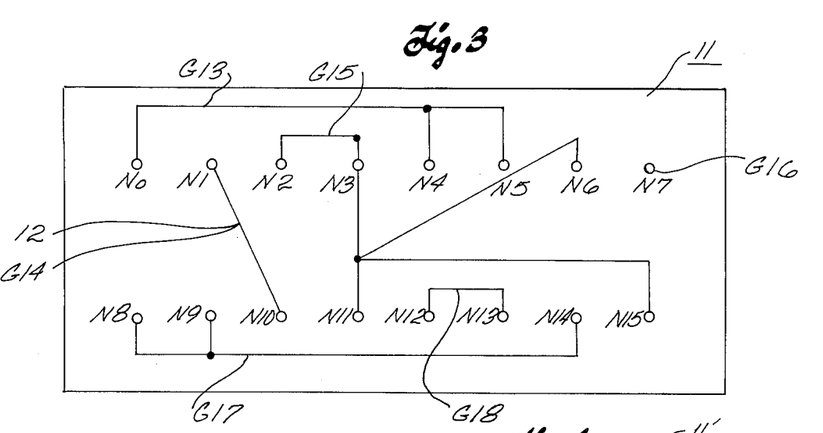
FIG. 3 schematically illustrates a typical printed circuit board that conforms to its design.

In FIG. 3, there is shown, by way of example, a circuit board 11 that conforms to its design in that it has a plurality of network nodes N0 through N15 and a plurality of inter-node branches such as branch 12 forming a predetermined node-connection pattern. By inspecting FIG. 3, it can be seen that the node-connection pattern defines a division of the network nodes into a plurality of groups of network nodes. One such group, G13, is a three-node group consisting of network nodes N0, N4, and N5. Each of the network nodes in group G13 is connected in common to all the other network nodes in its group and is isolated from the network nodes in each other group. Another such group, G16, is a single-node group consisting of the network node N7 that is of course connected to itself and is isolated from all the other network nodes.

It should be understood that the principles of this invention are applicable regardless of how many network nodes are involved in the circuit board being tested, and exemplary board 11, with its 16 network nodes, is depicted for illustrative purposes only with a view toward explaining important concepts by subordinating unimportant details. Equally, it should be understood that the topology of the network defined on board 11 does not in and of itself define a ranking or ordering of the network nodes. The sequential numbering of the network nodes as N0 through N15 is to that extent arbitrary. However, as further explained below, the continuity-checking operation of the testing apparatus of this invention proceeds in accordance with a selection sequence that does define an ordering of the network nodes.

Against the foregoing background, there is set forth below as Table I a listing in one column of which the groups of exemplary board 11 are designated, and, in the other column, the network nodes in the respective groups are identified.

TABLE I

| GROUP | NETWORK NODES |
| --- | --- |
| G 13 | N0, N4, N5 |
| G 14 | N1, N10 |
| G 15 | N2, N3, N6, N11, N15 |
| G 16 | N7 |
| G 17 | N8, N9, N14 |
| G 18 | N12, N13 |

Another way of describing the topology of a network such as that of exemplary board 11 is to state that it defines a FROM/TO set, with each element, symbolized herein in the general form P(F,T), of the set consisting of a "FROM" node and a "TO" node that are electrically connected together by either an intra-node branch or a path. Every network node is of course connected to itself (i.e., by its own intra-node branch) and, accordingly, a network having $n$ nodes has included as part of its FROM/TO set $n$ elements P(0,0), P(1,1), ... P(i,i), ... P(n,n). In addition to the foregoing $n$ elements, the FROM/TO set includes a number of other elements of the path-connected node pair type. With respect to the three nodes of group G13, for example, there are defined three such path-connected node pairs, viz, P(0,4), P(4,5), and P(0,5). It will be appreciated from what was set forth above in describing one prior art technique that a redundant operation has been employed in verifying that a path exists from network node N0 to network node N5, and in also verifying the existence of the inter-node branches for the node-pair elements P(0,4) and P(4,5). In general, the number of path-connected node pairs involved in a group containing $m$ network nodes is given by the well known formula from combinatorial mathematics $$\binom{m}{2} = \frac{m!}{2!\,(m-2)!}$$

To illustrate the foregoing by way of example, there is set forth below as Table IA a listing of the elements of the FROM/TO set defined by the network of board 11.

TABLE IA

| GROUP | FROM/TO SET | |
|---|---|---|
| | ELEMENTS OF INTRA-NODE BRANCH-CONNECTED TYPE | ELEMENTS OF PATH CONNECTED TYPE |
| G 13 | P(0,0), P(4,4), P(5,5) | P(0,4), P(4,5), P(0,5) |
| G 14 | P(1,1), P(10,10) | P (1,10) |
| G 15 | P(2,2), P(3,3), P(6,6), P(11,11), P(15,15) | P(2,3), P(3,6), P(6,11), P(11,15), P(2,6), P(2,11), P(2,15), P(3,11), P(3,15), P(6,15) |
| G 16 | P(7,7) | — |
| G 17 | P(8,8), P(9,9), P(14,14) | P(8,9), P(9,14), P(8,14) |
| G 18 | P(12,12), P(13,13) | P(12,13) |

Circuitry for performing the function of verifying continuity between a "FROM" node and a "TO" node is, in and of itself, very simple. A suitable continuity-verification circuit arrangement 19 is shown in FIG. 2. Circuit 19 has a first input node 20 and a second input node 21. Within circuit 19, a resistor 22 and a d.c. source 23 are connected in series between input nodes 21 and 20. A potentiometer 24 has its ends connected to opposite terminals of d.c. source 23 and has its movable contact connected to one input of a comparator circuit 25. The other input of comparator circuit is connected to the second input node 21. A signal lead 26 is provided for carrying a signal, referred to herein as the CV or continuity-verified signal, provided by comparator 25. In circumstances in which input nodes 20 and 21 are, externally to circuit 19, connected together, the CV signal equals '1'; otherwise, the CV signal equals '0'. Suitably, comparator circuit 25, like a comparator circuit 121 described hereinafter, is an integrated circuit sold by National Semiconductor under the designation LM319.

Figure 4:
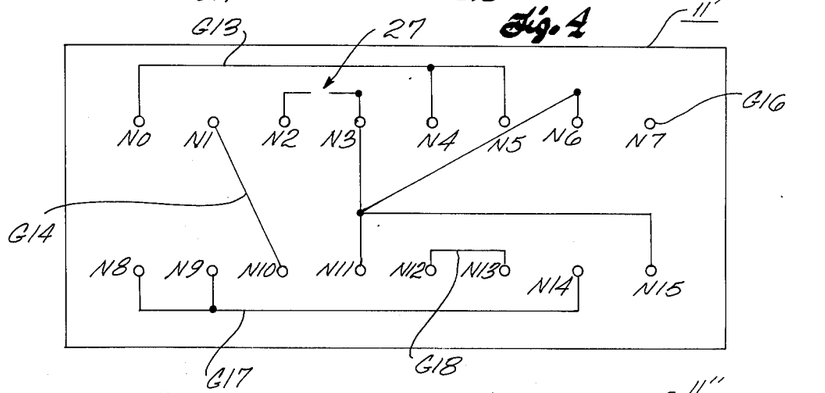
FIG. 4 schematically illustrates a printed circuit board which is almost identical to the circuit board of FIG. 3, but which has a fault in that an undesired discontinuity exists.

As a specific example illustrative of the foregoing, consider the following. With reference to FIG. 3, it can be seen that an inter-node branch extends between network nodes N2 and N3 in conformity to the network design. With reference to FIG. 4, it can be seen that a fault exists in that an undesired break 27 causes network nodes N2 and N3 to be isolated from each other on the defective board 11' depicted therein. As will be explained further below, at a particular point in time during testing of board 11, first input node 20 is switchably connected to network node N2 which then serves as a present FROM node (or, otherwise expressed, as a presently scanned node). Simultaneously, second input node 21 is switchably connected to network node N3. Owing to the presence of the desired branch between network nodes N2 and N3 on board 11, input nodes 20 and 21 are temporarily connected together and, in response, the CV signal specifies that the desired continuity has been verified by equaling '1'. On the other hand, in testing defective board 11', break 27 prevents such a connecting together of input nodes 20 and 21 when they are respectively switchably connected to network nodes N2 and N3 respectively of board 11'. In this circumstance, the CV signal specifies that desired continuity is lacking by equaling '0'.

The distinguishing features of the present invention reside in the method used and apparatus provided for connecting the first and second input nodes 20 and 21 to selected network nodes to verify that each network node is in fact connected in conformity to the design.

To effect a connection from first input node 20 to the presently scanned node, there is provided a first switching means 28. In the illustrated embodiment, switching means 28 includes four identical integrated circuits 29, 30, 31 and 32 each of which includes four independently operable bilateral switches to provide sixteen switches FS0 through FS15. Many more such switches may be provided as necessary in an embodiment adapted for testing boards having many more network nodes. Suitably, each of these integrated circuits is a conventional COS/MOS Quad Bilateral Switch of the type sold by various semiconductor manufacturers under the designation 4016. Each bilateral switch FS0 through FS15 defines first and second normally open contacts, the first one of which is individually connected to a respective one of a plurality of contactors C0 through C15 of jig 10. The second contact of each bilateral switch FS0 through FS15 is commonly connected to a signal lead 33 that connects switching means 28 to first input node 20. Each bilateral switch FS0 through FS15 further includes a control input to receive a respective one of a plurality of switch-close command signals FC0 through FC15. When, for example, command signal FC0 equals 1, switch FS0 closes so that contactor C0 is switchably connected to first input node 20. Jig 10 provides in conventional manner for connecting its contactors to the network nodes. Thus, network node N0 is switchably connected to first input node 20 during the time the FC0 signal equals '1'.

Switching means 28 further includes four other integrated circuits 34, 35, 36, and 37 for performing a latching function involved in an isolation-verification test. In an embodiment directed solely to continuity verification testing, circuits 34 through 37 may be entirely omitted. Each of the circuits 34–37 includes four tri-state latches (not individually shown). Suitably, each of these circuits is a conventional COS/MOS Quad 3-State R/S Latches of the type sold by various semiconductor manufacturers under the designation 4043. Each of the circuits 34 through 37 has an enable input that is connected to a signal lead 38 that carries a latch enable signal (LE).

Figure 1:
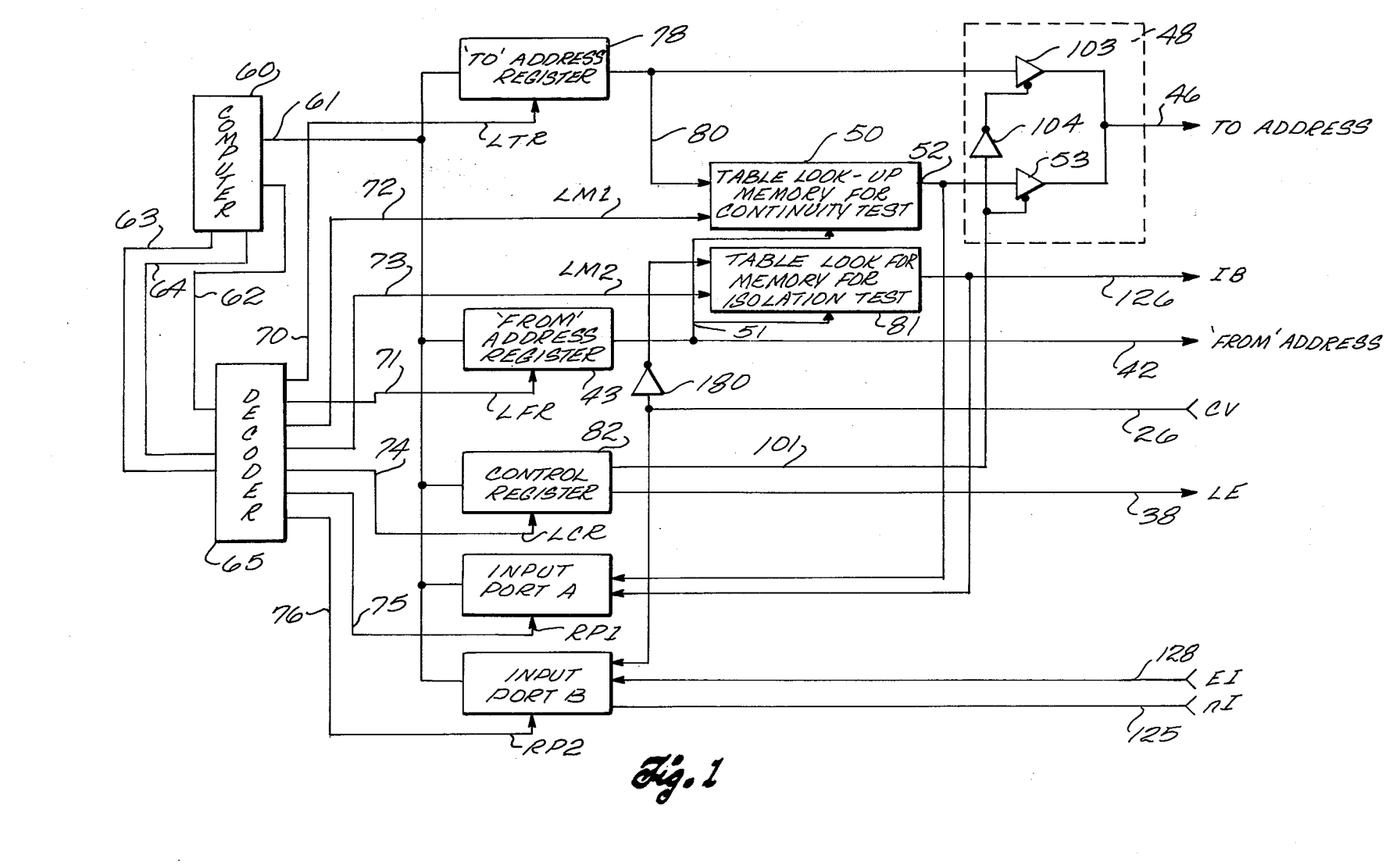
FIG. 1 is a block diagram depicting circuitry forming a portion of a control system for a testing apparatus embodying the present invention.

A FROM address decoder 40, suitably a four-to-16 line decoder of the type sold under the designation 14514, is connected by a 16-wire bus (generally indicated at 41) to the tri-state latches. Decoder 40 is further connected to a four-wire bus 42 to receive a sequence of FROM addresses and decode them one-by-one in conventional manner. Bus 42 carries the FROM addresses from a FROM address register 43 (FIG. 1). It will be appreciated that a 4-bit wide address can identify any one of the 16 network nodes of board 11. In an embodiment adapted to test a board having more network nodes, each address has more bits. For example, by employing an 11-bit wide address, and an appropriate decoder therefor, up to 2048 different network nodes can be individually selected.

Briefly, address register 43 is reset at the commencement of a continuity verification test (i.e., the initial address stored therein is 0000), and then the address stored therein is repeatedly indexed so as to count from 0000 to 1111. During the continuity verification test, the binary value of the LE signal places circuits 34–37 in a copying state, so that the FC0 through FC15 signals provided by the tri-state latches duplicate the output of decoder 40. It will be appreciated from the foregoing that network node N0 is first temporarily connected to input node 20, then it is disconnected and in its stead network node N1 is temporarily connected to input node 20, and so forth so that there is effected a group-independent scanning sequence.

With further reference to FIG. 2, there is shown therein a second switching means 44 and a TO address decoder 45 that are connected in tandem between a bus 46 and jig 10. Switching means 44, like switching means 28, includes four integrated circuits providing 16 bilateral switches TS0 through TS15. Commonly connected contacts of switches TS0 through TS15 are connected via a signal lead 47 to second input node 21 of circuit 19.

Bus 46 is connected to a multiplexor 48 (FIG. 1) that, during a continuity verification test, couples the output of a memory 50 to bus 46. Memory 50 is an addressable table look-up memory having a plurality of addressable locations. Owing to the development of large scale integration techniques, there are available, at relatively low cost, memories having a very large storage capacity. For example, there is available in a single integrated-circuit chip, commonly designated 2102, a 1024-bit read/write memory. For purposes of the illustrated embodiment, a single integrated circuit chip commonly designated SN 7489 and having 64-bit storage capacity, provides sufficient memory capacity. In other embodiments directed to testing boards having many more network nodes, a plurality of such chips can be connected together in conventional manner to provide appropriately larger storage capacity.

Memory 50 is connected by a four-wire RAM address bus 51 to the output of FROM address register 43. It is further connected by a four-wire RAM output bus 52 to multiplexor 48. Within multiplexor 48 there is provided, among other things, an integrated circuit 53 comprising a plurality of tri-state switches (not individually shown), of which four are used in the illustrated embodiment. Such an integrated circuit having six tri-state switches is sold by Fairchild Semiconductor Corporation under the designation 9LS368.

As was stated above, address register 43 is reset at the commencement of a continuity verification test. This results in the selection, from the network nodes, of a network node to serve initially as a presently scanned node. The network node which is so initially selected is the one connected to contactor C0, which, for exemplary board 11, is network node N0. Simultaneously with the initial selection of the presently scanned node, a selection is made of a network node to serve as a present verification-tested node. The latter selection is accomplished via a table look-up operation whereby a node selection signal stored at the addressed location of memory 50 is coupled to decoder 45 (FIG. 2). In coordination with the selection of the presently scanned and present verification-tested nodes, continuity verifying circuit 19 checks for continuity between the network nodes so selected. Thereafter, the address in address register 43 is indexed and the foregoing coordinated process is repeated.

Consider now Table II below which lists the addresses provided by register 43 to select addressable locations in memory 50 and the respective node selection signals that are stored in the addressed locations to provide for continuity verification testing of representative board 11. Table II also indicates the network nodes that are selected accordingly.

TABLE II
(For Board 11)

| Address Provided By From Address Reg. | Presently Scanned Node | Node Selection Signal Provided By Memory 50 | Present Verification Tested Node |
|---|---|---|---|
| 0000 | N0 | 0100 | N4 |
| 0001 | N1 | 1010 | N10 |
| 0010 | N2 | 0011 | N3 |
| 0011 | N3 | 0110 | N6 |
| 0100 | N4 | 0101 | N5 |
| 0101 | N5 | 0101 | N5 |
| 0110 | N6 | 1011 | N11 |
| 0111 | N7 | 0111 | N7 |
| 1000 | N8 | 1001 | N9 |
| 1001 | N9 | 1110 | N14 |
| 1010 | N10 | 1010 | N10 |
| 1011 | N11 | 1111 | N15 |
| 1100 | N12 | 1101 | N13 |
| 1101 | N13 | 1101 | N13 |
| 1110 | N14 | 1110 | N14 |
| 1110 | N15 | 1111 | N15 |

Table II shows that the network nodes of group G13 are individually selected in the following order to serve sequentially as the presently scanned node: First, network node N0 (when the FROM address is 0000); second, network node N4 (when the FROM address is 0100); and third, network node N5 (when the FROM address is 0101). Table II also shows that those network nodes of group G13 that are individually selected to serve sequentially as the presently verification-tested node are selected in the same relative order. In particular, network node N5 is selected later in the sequence than network node N4.

As another example illustrating the same point, consider group G15. The network nodes of group G15 are individually selected to serve as the presently scanned node in the following order: N2, N3, N6, N11, and N15. The network nodes of group G15 are individually selected to serve as the present verification-tested node in the following order: N3, N6, N11, N15, and N15 (again). While network nodes N2 and N3 are simultaneously connected to first and second input nodes 20 and 21 respectively, circuit 19 verifies the existence of the single branch between network nodes N2 and N3. Later, while network nodes N3 and N6 are simultaneously connected to first and second input nodes 20 and 21 respectively, circuit 19 verifies the existence of the tandem branches extending between network nodes N3 and N6 via network node N11. Later, while network nodes N6 and N11 are simultaneously connected to first and second nodes 20 and 21 respectively, circuit 19 verifies the existence of the single branch between network nodes N6 and N11. Parenthetically, there is no redundancy in the last-mentioned verification even though the branch is part of the previously verified two-branch path. This is so because a thorough check requires a verification that the network node N11 is connected to the branch. Later, while network nodes N11 and N15 are simultaneously connected to input nodes 20 and 21 respectively, circuit 19 verifies the existence of the single branch between network nodes N11 and N15. Finally, network node N15 is simultaneously connected to both input nodes 20 and 21 and, of course, continuity is verified. The last-mentioned verification, although not essential, is convenient because, in effecting it, the continuity verification signal (CV) will become equal to '1', and this signal is preferably used in advancing the scanning sequence from step to step.

To restate the foregoing in the terminology employed in Table IA, the following elements of the FROM/TO set are checked in the following sequence: P(0,4), P(1,10), P(2,3), P(3,6), P(4,5), P(5,5), P(6,11), P(7,7), P(8,9), P(9,14), P(10,10), P(11,15), P(12,13), P(13,13), P(14,14), and P(15,15). As to each of the foregoing elements that are of the path-connected type, the TO node thereof is specified from the network nodes on the basis of its being the lowest order node which both has not prior thereto in the sequence constituted the presently scanned node and is designed to have a path connecting it to the presently scanned node.

Taking, as one example, the first node-pair element selected in the sequence, P(0,4), the TO node thereof, network node N4, has not prior thereto in the sequence constituted the presently scanned node and is the lowest order node of the network nodes N4 and N5 that are designed to have a path connecting it to presently scanned node N0. As another example, consider the path-connected node pair P(6,11). The presently scanned node or FROM node thereof, N6, is designed to be connected to network nodes N2, N3, N11, and N15. Of these four network nodes, two, N2 and N3, have previously constituted the presently scanned node. Of the remaining two, N11 and N15, the lowest order node is N11 and thus it is specified as the TO node.

In the illustrated embodiment, the advancing from step to step in the scanning sequence is controlled by a conventional small-scale computer 60 sold by Intel Corporation under the designation SBC80/10. Computer 60 includes a programmable read only memory (PROM, not shown) that may be programmed in conventional manner in accordance with an instruction manual distributed by INTEL to perform conventional computer processing tasks including writing and reading data words into and out of a random access memory therein. Computer 60 has a data bus 61. The SBC80/10 computer has an eight-wire bi-directional data bus of which only four wires (not individually shown) are used in the illustrated embodiment. The SBC80/10 computer further has a 16-wire address bus 62 and a plurality of control outputs that are provided to control external gating circuits in executing input/output operations. In the illustrated embodiment, two of these control outputs are connected to signal leads 63 and 64. Signal leads 63 and 64 carry control signals that are gated to control write and read operations described hereinafter.

Bus 62 and signal leads 63 and 64 are connected to inputs of a decoder 65.

Address bus 62 is used internally within computer 60 in conventional manner for addressing its internal memories. Particular addresses that are involved in input-/output operations are decoded by decoder 65 to provide control signals on signal leads 70 through 76.

Signal lead 70 carries an LTR (Load To Register) control signal defining time spaced-apart write pulses. A TO address register 78 has written into it a 4-bit signal then present on bus 61 each time a write pulse is defined in the LTR control signal. Signal lead 71 carries an LFR (Load From Register) control signal defining time spaced-apart write pulses. FROM address register 43 has written into it the 4-bit signal then present on bus 61 each time a write pulse is defined in the LFR control signal. Signal lead 72 carries a LM1 (Load Memory 1) control signal defining time spaced-apart write pulses. Memory 50 is responsive to the write pulses defined in the LM1 control signal. In particular, memory 50 has a data input that is connected by a bus 80 to the output of TO address register 78. In response to each write pulse it receives, memory 50 stores the then present output of register 78 in the location then being addressed by register 43. Signal lead 73 carries a LM2 (Load Memory 2) control signal defining time spaced-apart write signals. A memory 81, which suitably has the same construction as memory 50, is responsive to the write pulses defined in the LM2 signal. Memory 81 is provided to perform functions involved in an isolation verification test mode. Signal lead 74 carries a LCR (Load Control Register) control signal to a control register 82. Signal leads 75 and 76 carry RP1 and RP2 control signals respectively that define time spaced-apart read signals to cause signals to be inputted into computer 61.

There will now be explained the principles underlying an isolation verification test performed by the illustrated embodiment. In this testing mode, a lower order bulk shorting technique is employed. In part, this involves a sequential connecting together of network nodes to form a progressively expanding set of network nodes. This set initially consists of network node N0. Next, network nodes N0 and N1 are connected together so that the set expands to include network nodes N0 and N1. Next, network nodes N0, N1, and N2 are connected together so that the set expands to include network nodes N0, N1, and N2. The foregoing sequence progresses until the set has expanded to include all the network nodes from N0 to N14.

In the illustrated embodiment, the connecting together is effected by switches FS0, etc., in switching means 28. Accordingly, the above-mentioned set is sometimes hereinafter referred to as the "set of FROM nodes."

In coordination with the progressive expansion of the set of FROM nodes, there is effected a sequence of individual selections each defining an isolation-tested TO node. In particular, the network node so selected to serve as the isolation-tested TO node is the next higher order node above the highest order node then in the set of FROM nodes.

Inspection of board 11 reveals that network node N0 and all lower order nodes (of which there are none in this case) are isolated from the next higher network node, viz, network node N1. Thus, when the set of FROM nodes consists of network node N0 and the isolation-tested node is network node N1, an isolation condition exists therebetween. Such an inspection further reveals that network node N1 and all lower order nodes (of which there is one, viz network node N0, in this case) are isolated from the next higher network node, viz, network node N2. Thus, when the set of FROM nodes consists of network nodes N0 and N1, and the isolation tested node is network node N2, an isolation condition exists therebetween.

Consider now Table III which lists the foregoing and the remaining cases for representative board 11. In the column headed isolation condition, a '1' used to indicate isolation and a '0' is used to indicate that the isolation-tested TO node is connected by a path on the board to at least one of the network nodes in the set of FROM nodes.

TABLE III

| Set of "From" Nodes | Isolation-Tested "TO" Node | Isolation Condition |
|---|---|---|
| N0 | N1 | 1 |
| N0-N1 | N2 | 1 |
| N0-N2 | N3 | 0 |
| N0-N3 | N4 | 0 |
| N0-N4 | N5 | 0 |
| N0-N5 | N6 | 0 |
| N0-N6 | N7 | 1 |

TABLE III-continued

| Set of "From" Nodes | Isolation-Tested "TO" Node | Isolation Condition |
|---|---|---|
| N0-N7 | N8 | 1 |
| N0-N8 | N9 | 0 |
| N0-N9 | N10 | 0 |
| N0-N10 | N11 | 0 |
| N0-N11 | N12 | 1 |
| N0-N12 | N13 | 0 |
| N0-N13 | N14 | 0 |
| N0-N14 | N15 | 0 |

As is explained more fully below, the information set forth above in Table III defines the mapping provided by table look-up memory 81. When, for example, network node N0 is addressed as the highest order node of the set of FROM nodes, the location of memory 81 that is simultaneously addressed provides an isolation condition bit (IB) equal to '1'.

Consider now the flow chart of FIG. 7 which will be explained with continued reference to FIGS. 1 and 2. At the start of an isolation verification test (see block 100), computer 60 causes FROM address register 43 to be reset so that the FROM address is 0000, and causes TO address register 78 to be set so that the TO address is 0001. Computer 60 causes the resetting of register 43 by applying the FROM address to data bus 61 and applying a write control pulse to signal lead 63. Decoder 65, responsive to the presence of a first predetermined address on address bus 62, couples the write control pulse to signal lead 71. Computer 60 then causes the setting of register 78 by applying the TO address to data bus 61 and applying a write control pulse to signal lead 63. Decoder 65, responsive to the presence of a second predetermined address on address bus 62, couples the write control signal to signal lead 70. The foregoing is summarized in the flow chart in block 100 as "Set FROM = 0, Set TO = 1."

After so initializing registers 43 and 78, computer 60 enables the latches in switching means 28. It does so by simultaneously applying a write pulse to signal lead 63, and a predetermined signal to data bus 61. Decoder 65, responsive to a third predetermined address on address bus 62, couples the write pulse to signal lead 74. Control register 82 thus has loaded into it the predetermined signal. Control register 82, which like registers 43 and 78 is suitably a conventional SN74175 integrated circuit, stores the predetermined signal for the duration of the isolation verification test. One of the stages (not individually shown) of control register 82 is connected by a signal lead 101 to multiplexor 48. In multiplexor 48, circuit 53 has its inhibit input connected to signal lead 101, and a circuit 103, identical in construction to circuit 53, has its inhibit input connected to the output of an inverter 104 which in turn has its input connected to signal lead 101. For the duration of the isolation verification test, circuit 103 couples the output of register 78 to bus 46 and circuit 53 interrupts coupling of the output of memory 50 to bus 46.

Another stage of control register 82 is connected by signal lead 38 to switching means 28 (FIG. 2). It will be recalled that the latches in circuits 34 through 37 are controlled by the LE signal carried by signal lead 38.

Figure 7:
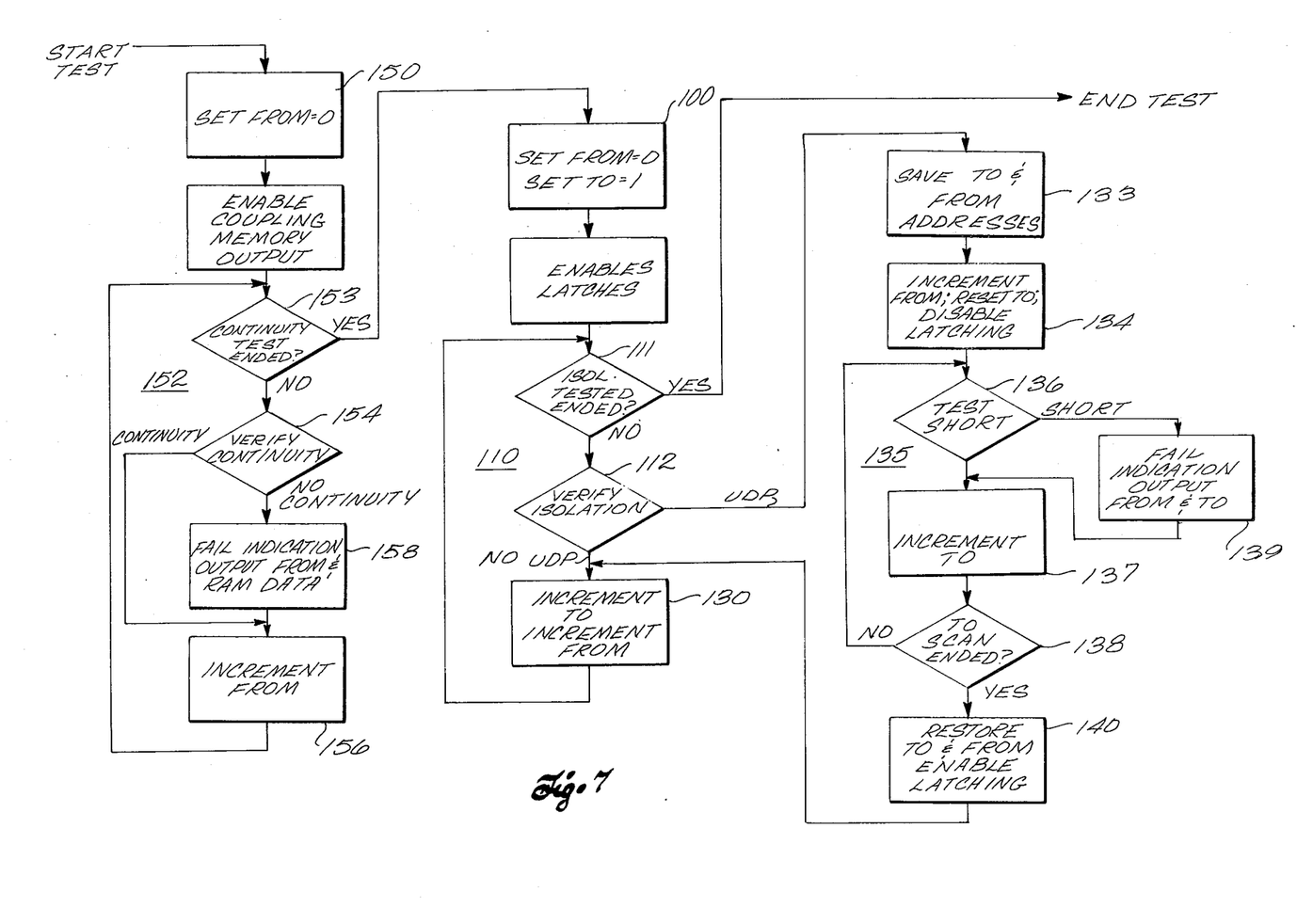
FIG. 7 is a flow chart showing the sequence of operation involved in deriving data from the table lookup memories to check a board under test.

With further reference to FIG. 7, after the step of enabling the latches, a loop 110 is entered. In each traversal of loop 110, there is executed a status check represented by block 111. If the outcome of the status check is that the overall isolation verification test has ended, then loop 110 is exited. Otherwise, the sequence continues within loop 110. This is represented in block 111 as "Isolation Test Ended?" Before the overall test can end, a sequence of sub-tests must be effected.

In each of the sequence of sub-tests, there is executed a sampling check represented by block 112. To explain this sampling check, reference is made again to FIG. 2 wherein there is shown a comparison means 120. Within comparison means 120 there is a comparator 121 identical to comparator 25 in circuit 19, a NAND gate 122, and a potentiometer 123. One input of comparator 121 is connected to signal lead 47 and its other input is connected to the movable contact of potentiometer 123. Potentiometer 123 is biased by d.c. source 23. The output of comparator 121 is connected by a signal lead 125 to one input of NAND gate 122. The other input of NAND gate 122 is connected by a signal lead 126 to the output of memory 81 (FIG. 1). The output of NAND gate 122 is connected by a signal lead 128 to an input port B (FIG. 1). An enable indexing (EI) signal is carried by signal lead 128. Suitably, input port B and an input port A discussed below, are each identical in construction to circuit 53. The output of comparator 121 is connected by signal lead 125 to input port B. A not isolated ($nI$) signal is carried by signal lead 125.

In circumstances in which continuity exists from signal lead 33 to signal lead 47, the $nI$ output signal of comparator 121 equals '1'; otherwise it equals '0'. In circumstances in which the two signals received by NAND gate 122 each equal '1', the output thereof equals '0'; otherwise, it equals '1'.

During the initial execution of sampling check 112, decoder 40, switching means 28, and jig 10 cooperate in response to the initial FROM address (i.e., 0000) to switchably connect network node N0 to signal lead 33. Simultaneously, decoder 45, switching means 44 and jig 10 cooperate in response to the initial TO address (i.e., 0001) to switchably connect network node N1 to signal lead 47. Inasmuch as board 11 lacks an inter-node path between network nodes N0 and N1, the output of comparator 121 equals '0'. As is well known, whenever either one (or both) of the two signals received by a NAND gate equals '0', its output equals '1'. Accordingly, when, as at this point, the output of comparator 121 equals '0', it forces the EI output signal of NAND gate 122 to equal '1'. Although it will be appreciated that this is a "don't care" situation with respect to the value of the IB signal, it is mentioned for completeness that at this time, a '1' level is derived from the addressed location of memory 81 and is carried by signal lead 126 to NAND gate 122.

As part of the sub-test, computer 60 causes the EI output signal of NAND gate 122 to be inputted into the computer. To this end, computer 60 applies a read control pulse to signal lead 64. Decoder 65, responsive to a predetermined address applied to address bus 62, couples the read pulse to signal lead 76. In response, input port B couples the EI signal on signal lead 128 to data bus 61, thereby providing the EI signal to the computer to indicate the outcome of sampling check 112.

When the value of the EI signal so inputted into computer 60 is '1', computer 60 causes the addresses in registers 43 and 78 to be indexed. This is indicated in FIG. 7 by block 130. In the first pass through loop 110, TO address register 78 is set so that the TO address stored therein increments from its initialized value (0001) to the next higher value (0010). The details as to how addresses are loaded into these registers are set forth above.

Following the incrementing of registers 43 and 78, another status check is made as to whether the isolation verification test has ended. If the FROM address, as incremented, is the highest order node, viz, network node N15 for board 11, the test is ended. Otherwise, there ensues another pass through loop 110.

During the second pass through loop 110, switch TS2 is the only switch in switching means 44 that is closed. This causes network node N2 to be connected via signal lead 47 to isolation verification means 120.

On the other hand, both switches FS0 and FS1 in switching means 28 are closed, thereby bulk-shorting network nodes N0 and N1 to signal lead 33. This is so because of the operation of the latch circuits in switching means 28. Since board 11 lacks an inter-node path between network node N2 and either network node N1 or network node N0, comparator 121 causes its output signal to equal '0'. It will be appreciated therefore that the EI signal again equals '1' thereby enabling entry into block 130 (FIG. 7). Parenthetically, as indicated by Table III above, the isolation bit provided by memory 81 equals '1' when the FROM address in register 43 equals 0001.

Figure 5:
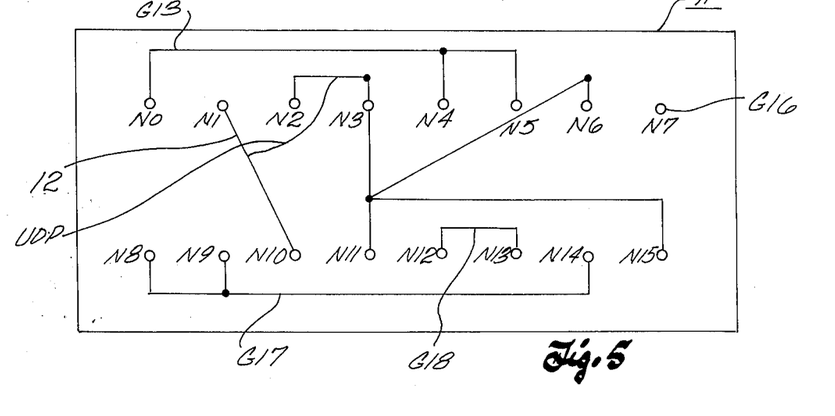
FIG. 5 schematically illustrates a printed circuit board which is almost identical to the circuit board of FIG. 3, but which has a fault in that an undesired short circuit exists.

Consider now an example of operation in which an isolation-verification test is conducted with defective board 11" of FIG. 5. In the same manner as described above, with reference to block 100 (FIG. 7), the FROM and TO address registers 43 and 78 are initialized to select network nodes N0 and N1 as the set of FROM nodes and the isolation-tested node respectively. The latches in switching means 28 are enabled and loop 110 is entered to make the first pass therethrough.

Network node N1 of board 11", like network node N1 of board 11, conforms to the network design in that it is isolated from network node N0. Thus, computer 60 responds to this value of the EI signal such that block 130 is entered so as to increment FROM address register 43 and TO address register 78. At this point, the address stored in FROM address register equals 0001, and owing to the operation of the latch circuits, switches FS0 and FS1 bulk short network nodes N0 and N1. Simultaneously, the address stored in TO address register 78 equals 0010 so that network node N2 is selected as the present isolation-tested node.

On board 11", there is a fault in that an undesired path UDP causes network node N2 to be connected to network node N1. During the second pass through loop 110, comparator 121 detects this undesired path and causes its output signal to equal '1'. At the same time the IB signal equals '1', as indicated by the second line in Table III. With each of the signals received by NAND gate 122 equaling '1', its output, the EI signal equals '0'. Computer 60 responds to this value of the EI signal such that loop 110 is exited and block 133 is entered. At this point, computer 60 executes a conventional internal computer operation whereby a copy of the present addresses in registers 43 and 78 is saved in storage means within computer 60. The next block entered in the sequence is block 134. At this point, computer 60 increments the FROM address in register 43, resets register 78, and disables the latches.

Next, an ambiguity-resolving loop 135 is entered. In each pass through loop 135 there is executed a sampling check 136. In the first pass through loop 135, switch TS0 is closed because register 78 has been reset. Also, in this example, switch FS2 is closed because register 43 was incremented during block 134 to select this particular switch. Comparison means 120 is thus connected to network nodes N0 and N2.

In this example, the fault lies elsewhere than between network nodes N0 and N2, and accordingly, the nI signal equals '0' at this point. In the same manner as described above with reference to sampling check 112, the nI signal is inputted into computer 60 to indicate the outcome of sampling check 136. Computer 60 responds to this '0' value of the nI signal such that block 137 is entered and the address in register 78 is incremented. Next, there is executed a status check 138. Unless every network node has served temporarily as a present TO node in one of a sequence of passes through loop 135, another pass therethrough ensues.

During the second pass through loop 135, network nodes N1 and N2 are checked because register 43 still stores 0010 whereas at this point register 78 stores 0001. The fault in board 11" resides in UDP extending between network nodes N1 and N2. During sampling check 136, comparator 121 detects this fault, and its nI output signal equals '1'. Computer 60 responds thereto and provides a fault indication via a conventional peripheral device (not shown) such as a printer. This is represented in FIG. 7 by block 139.

Following block 139, loop 135 is re-entered by executing block 137 again. As a result of executing block 137, both the FROM and TO addresses equal 0010. Thus, network node N2 is connected to both inputs of comparator 121 during this pass, thereby causing its nI output signal to equal '1' again. Although this is not, of course, a fault situation, it is convenient to have a complete list of all nodes to which node N2 is connected. As for board 11", network node N1 (undesirably), and network nodes N2, N3, N6, N11, and N15 (each desirably) are connected to network node N2. During the respective passes through loop 135, block 139 is entered in the same manner as described above. Eventually, the outcome of status check 138 causes loop 135 to be exited so that the sequence proceeds to block 140. At this point, steps are taken in preparation for further isolation testing so that the rest of circuit board 11", can be tested to determine whether there are any additional undesired paths. In such preparation steps, computer 60 causes the LE signal to have the appropriate value again so that the latches can appropriately control the lower order bulk shorting. Computer 60 then sequentially loads addresses into register 43 so as to restore the latches to the state prevailing at the time sampling check 112 revealed the UDP. The sequentially loaded addresses are those addresses below and equal to the FROM address previously saved in execution of block 133. The previously saved TO address is loaded into register 78. Following execution of block 140, loop 110 is re-entered by executing block 130 again. As for board 11", there are no such other faults, and accordingly, loop 110 is repeatedly traversed until the outcome of status check 111 reveals that all nodes have been tested.

FIG. 7 also shows the sequence of events occurring during a continuity-verification test. This portion of the flow chart is best described in an example involving testing of board 11' (FIG. 4). As was mentioned above, board 11' has a fault in that a break 27 undesirably interrupts continuity between network nodes N2 and N3.

At the start of the continuity-verification test, block 150 is entered. Execution of block 150 involves computer 60 resetting register 43 so as to select network node N0 as the initial presently scanned node. Following execution of block 150, computer 60 loads control register 82 (FIG. 1) with a control signal so that the signal carried by signal lead 101 enables circuit 53 and inhibits circuit 103. Thus, node selection signals derived from memory 50 can thereafter be coupled to bus 46.

Next, a loop 152 is entered. A status check 153 is executed as a part of loop 152 to determine whether or not the continuity-verification test has ended. Unless all network nodes have been individually selected, the sequence proceeds to sampling check 154. In the first pass through loop 152, the FROM address is 0000. Accordingly, as shown in Table II, the node selection signal derived from memory 50 is 0100. This address is coupled to decoder 45 via circuit 53 and bus 46 with the result that switch TS4 is closed. At the same time, switch FS0 is closed. Circuit 19 detects the inter-node branch extending between network nodes N0 and N4, and its CV output signal equals '1'. By virtue of an inputting operation as described above, the value of the CV signal is coupled into computer 60 through input port B. Since the outcome of sampling check 154 thus indicates that the desired continuity exists, the sequence proceeds to block 156.

In executing block 156, computer 60 increments the address in register 43, and thereafter status check 153 is performed again. As a result of the first pass through loop 152, the FROM address now equals 0001. Thus, network node N1 serves as the presently scanned node during the second pass through loop 152. During execution of sampling check 154 in this pass, memory 50 provides a node selection signal equal to 1010, as shown in Table II. With network node N1 serving as the presently scanned node and with network node N10 serving as the verification-tested node, circuit 19 detects the desired inter-node branch extending therebetween, and block 156 is entered again.

During the third pass through loop 152, node N2 is the present verification-tested node. Break 27 on board 11' interrupts the desired inter-node path therebetween. This break is detected by circuit 19 whose CV output signal so indicates by equalling '0'. With the outcome of sampling check 154 being 'no continuity', the sequence proceeds to block 158. During block 158, computer 60 provides a read control pulse on signal lead 64. Decoder 65, responsive to a predetermined address on address bus 62, couples the read pulse to input port A via signal lead 75. Input port A, in response, couples the output of memory 50 to data bus 61 for receipt by computer 60. The output of memory 50, of course, identifies the present verification-tested node, which has been determined to be undesirably isolated from its group. In the same manner as described above with reference to block 139, a peripheral device is used to display the information as to where the fault lies. Following this, the sequence proceeds so as to determine whether any additional undesired breaks exist.

Figure 6:
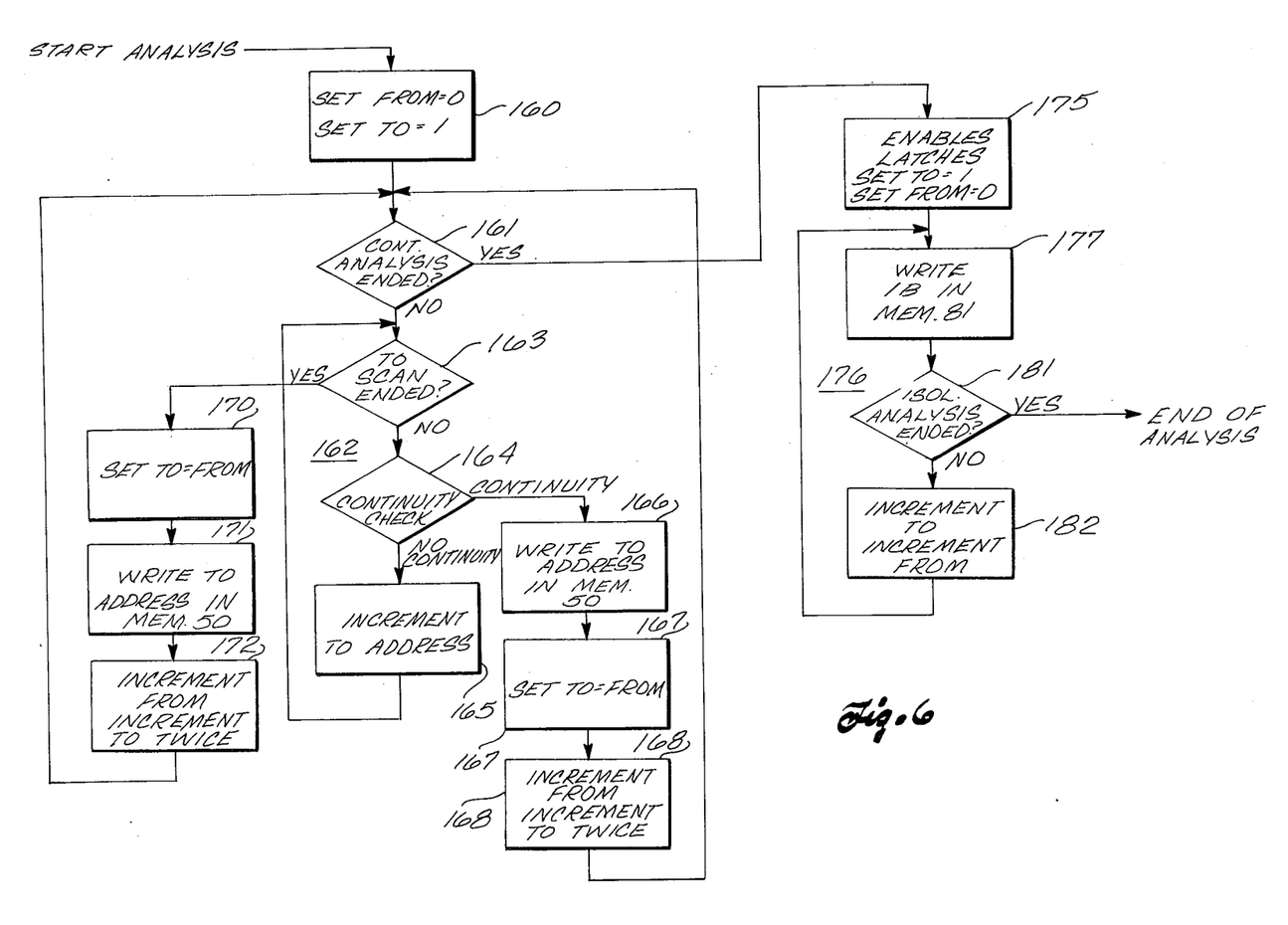
FIG. 6 is a flow chart showing the sequence of operation involved in accumulating data in the table look-up memories of FIG. 1 in the course of analyzing a master printed circuit board.

Consider now FIG. 6 which shows the sequence of events involved in analyzing a master board to accumulate information in memories 50 and 81 for subsequent testing of board designed to have the same node-connection pattern as the master board.

At the start, as represented by block 160, computer 60 initializes registers 43 and 78 so that network node N0 is selected as an initial FROM node and network node N1 is selected as an initial TO node. Next, a status check 161 is executed to determine whether further analysis is required. Until every network node has served as a FROM node, further analysis is of course required. Thus, if the present FROM address is 1111 or less, the sequence proceeds to enter a loop 162.

Within loop 162, a status check 163 is executed. If the present TO address is less than 1111, the sequence proceeds to a sampling check 164. In the first pass through loop 162, the present FROM node is network node N0 and the present TO node is network node N1. In analyzing board 11, for example, circuit 19 detects that network nodes N0 and N1 are unconnected on board 11, and so indicates with its CV signal equalling '0'.

In the same manner as described above, the CV signal is inputted into computer 60 to indicate the outcome of sampling check 164. Because of the indicated lack of continuity, the sequence proceeds to block 165. At this point, computer 60 increments the address in register 78 so that network node N2 is selected as the present TO node, and there follows a second pass through loop 162.

Inasmuch as network nodes N2 and N3 are each isolated from network node N0, the second and third passes through loop 162 proceed in the same fashion. During the fourth pass, the present TO node is network node N4 which in board 11 is connected to network node N0. Thus, the outcome of sampling check 164 during this fourth pass indicates continuity. At this point, loop 162 is exited so that the sequence proceeds to block 166. It will therefore be appreciated that the foregoing cyclical flow of operations results in the identification of the lowest order node above the present FROM node that is in the same group as the present FROM node.

In execution of block 166, the then present address in register 78 is written into memory 50. To this end, computer 60 provides a write pulse on signal lead 63. Decoder 65, responsive to a predetermined address on bus 62, couples the write pulse to a signal lead 72 to memory 50. Register 43 at this point still stores 0000, and, accordingly, the contents (i.e., 0100) of register 78 are written into the memory location whose address is 0000.

Following block 166, the sequence proceeds to block 167 whereupon computer 60 loads into register 78 the same address as is presently stored in register 43. At the time of first execution of block 167, register 43 stores 0000. Next, the sequence proceeds to block 168 whereupon computer 60 increments address register 43 once and increments address register 78 twice (i.e., to 0010).

Following block 168, the sequence returns to status check 161 again. Since the FROM address is still less than 1111, the second execution of status check 161 is followed by a re-entry into loop 162. In the same manner as described above, there ensues a sequence resulting in an identification of the lowest order node above the present FROM node that is in the same group as the present FROM node. With network node N1 serving as the present FROM node, the sequence involves passes through loop 162 as the TO node changes from network node N2 to network node N3, and so forth, until the TO node is network node N10. At that point, the outcome of sampling check 164 results in an exiting from loop 162 to proceed through blocks 166–168 and then a re-entry into loop 162 in the same manner as described above.

The foregoing description as to the two cases in which network nodes N0 and N1 serve sequentially as a present FROM node fully explains all the operations involved in the subsequent cases in which network nodes N2 through N6 serve one by one as the present FROM node. Consider now the case wherein network node N7, a completely isolated node, serves as the present FROM node. In this case, loop 162 will be passed through repeatedly until network node N15 serves as the TO node. At that point, the outcome of status check 163 is such that loop 162 is exited and the sequence proceeds to block 170.

Execution of block 170 causes the address in register 43 to be loaded into register 78. In the case of network node N7 as the present FROM node, the address is 0111. Following block 170, the sequence proceeds to block 171 whereupon the address in register 78 is written into the addressed location of memory 50. In this case, the address in register 78 is 0111 and the memory location is the one whose address is 0111. Following block 171, the sequence proceeds to block 172 whereupon computer 60 increments the address in register 43 and increments the address in register 78 twice. Following block 172, the sequence returns to status check 161. The foregoing description fully explains all the operations involved in accumulating the node selection signals into memory 50.

When the sequence has proceeded to the point at which network node N15 is the FROM node, loop 162 is entered for the last time. The sequence proceeds through blocks 170 to 172, whereupon, among other things, the FROM address is increased so as to exceed 1111. Upon return to status check 161 the outcome is therefore such that block 175 is entered.

Block 175 is the start of a network analysis sequence by which the isolation bits are written into memory 81. In execution of block 175, the latches in switching means 28 are enabled by the LE signal. Also, register 43 is reset to 0000, and register 78 is set to 0001.

Next, a loop 176 is entered. In the first pass through loop 176, the set of FROM nodes consists of the single network node N0 and the TO node is network node N1. On board 11, network node N1 is isolated from network node N0, and therefore the CV signal now equals '0'. In execution of block 177, the complement of the CV signal is written into memory 81. With reference to FIG. 1, an inverter 180 provides for complementing the CV signal. To write the output of inverter 180 into memory 81, computer 60 provides a write pulse on signal lead 63. Decoder 65, responsive to a predetermined address on address bus 62, couples the write pulse to signal lead 73. Memory 81 receives an address (at this point, 0000) via bus 51 from register 43, and therefore the complement of the CV signal is written into that addressed location.

Following block 177, a status check 181 is executed to determine whether further analysis is required. Unless the analysis has ended, the sequence proceeds to block 182 whereupon the addresses in registers 43 and 78 are each incremented. The result of executing block 182 during the first pass, then, is that register 43 stores 0001 and register 78 stores 0010. Because the latches are enabled, both switches FS0 and FS1 are closed thereby bulk shorting network nodes N0 and N1 as the set of FROM nodes. Simultaneously, switch TS2 is closed so that network node N2 is the present TO node.

Accordingly, when block 177 is executed the second time, the isolation condition relating network node N2 with respect to network nodes N0 and N1 is written into memory 81, at its address 0001.

Repeated looping through the sequence of loop 176 ensues. In the last complete pass through loop 176, the present TO node is network node N14 and the set of FROM nodes includes all the lower order nodes N0 through N13. The last execution of block 182 causes the FROM address to equal 1111. After the last complete pass, a partial pass ensues in which block 177 is executed, thereby writing a '0' into address 1110 of memory 81, and then execution of status check 181 causes loop 176 to be exited because the TO address is at its maximum value 1111.

The foregoing explains how the node selection signals are written into memory 50 and the isolation condition bits are written into memory 81. Advantageously, the testing apparatus provides for reading out the contents of memories 50 and 81 and loading the read-out information into a bulk storage means such as a magnetic tape or the like. To this end, as shown in FIG. 1, bus 52 is connected to input port A so that the node selection signals can be inputted into computer 60. Also, signal lead 126 is likewise connected to input port A so that the isolation condition bits can be inputted into computer 60.

I claim:

1. A continuity-check testing apparatus for testing a network having a plurality of network nodes, the network when conforming to its design having a predetermined node-connection pattern defining a division of the network nodes into a plurality of groups of network nodes with each network node being connected in common to all other network nodes in its group and being isolated from the network nodes in each other group, the apparatus comprising:

continuity verifying means having a first input node connectable to a presently scanned node, a second input node connectable to a present verification-tested node, and means for providing a signal specifying whether continuity exists between the first and second input nodes when they are connected to the scanned and tested nodes; and timing and control means for connecting the first and second input nodes to selected network nodes to verify that each network node is in fact connected in conformity to the design, the timing and control means including:

first selecting means for individually selecting network nodes in a group-independent scanning sequence defining an ordering of all the network nodes, each network node at the time of its selection by the first selecting means then constituting the presently scanned node;

first switching means for connecting the presently scanned node to the first input node;

second selecting means for individually selecting network nodes by reference to their order in a group-dependent sequence progressing such that as to each group network nodes thereof are sequentially selected by the second selecting means in the same order that they are sequentially selected by the first selecting means, each network node at the time of its selection by the second selecting means then constituting the presently verification-tested node; and second switching means for connecting the presently verification-tested node to the second input node.

2. Apparatus according to claim 1, wherein the second selecting means includes means for selecting the presently scanned node each time the first selecting means selects the highest order node of a group so that the first and second nodes are then short-circuited to the same network node.

3. Apparatus according to claim 2, wherein the second selecting means includes memory means for providing a sequence of node selection signals, and means for controlling the second switching means in accordance with the provided sequence of node selection signals.

4. Apparatus according to claim 3, wherein the memory means comprises a table look-up memory having a plurality of addressable locations each having stored therein a respective one of the sequence of node selection signals, and means for addressing the table look-up memory in coordination with the scanning sequence.

5. Apparatus according to claim 1, and further comprising isolation-verification test means for verifying that the network nodes of one group are isolated from the network nodes of all other groups.

6. Apparatus according to claim 1, wherein the first selecting means includes a register for storing a first address, means for repeatedly indexing the first address, and means for causing the first switching means to connect a different network node to the first input node each time the first address is indexed.

7. Apparatus according to claim 6, wherein the second selecting means includes a table look-up memory having a plurality of addressable locations each having stored therein a respective one of a sequence of node selection signals, the memory having an address input coupled to receive the first address and having an output on which it provides the node selection signals in a sequence coordinated with the indexing of the first address, and means for controlling the second switching means in accordance with the provided sequence of node selection signals.

8. Apparatus according to claim 7, wherein each of a preselected set of the memory locations has stored therein a node selection signal that causes the second switching means to connect to the second input node the same network node as the first switching means is then connecting to the first input node.

9. Apparatus according to claim 7, wherein the second selecting means includes read/write memory means, and wherein the apparatus further comprises operating mode selection means for selecting an analysis mode and a test mode, network analyzing means operable during the analysis mode for writing into the read/write memory means a sequence of node selection signals, and means operable during the test mode for reading from the read/write memory means the sequence of node selection signals to control the second switching means in accordance therewith.

10. A continuity-check testing apparatus for testing a network having a plurality of network nodes, the network being designed to have a plurality of inter-node branches defining a set of path-connected node pairs and being defective if any such inter-node branch is absent, the apparatus comprising:

branch detecting means having a first input node, a second input node, and means for providing a signal specifying whether a branch has been connected between the first and second input nodes;

scanning means for singularly selecting the network nodes in a sequence defining an ordering of the network nodes, which ordering includes a relative ordering of each path-connected node pair as constituting a lower order element of the pair and a higher order element of the pair, each network node at the time of its selection in the sequence then constituting a presently scanned node, the scanning means including first switching means for connecting the presently scanned node to the first input node;

second switching means controllable to connect the second input node to any specified one of the network nodes; and means for controlling the second switching means so that, in coordination with the sequential selection of each lower order element as the presently selected node, the specified network node is the lowest order node which both has not prior thereto in the sequence constituted the presently scanned node and is designed to have a path connecting it to the presently scanned node.

11. A method of checking a network having a plurality of network nodes, the network when conforming to its design having a predetermined node-connection pattern defining a division of the network nodes into a plurality of groups of network nodes with each network node being connected in common to all the other network nodes in its group and being isolated from the network nodes in each other group, the method comprising the steps of:

a. selecting, from the network nodes, a network node to serve initially as a present FROM node;

b. selecting repeatedly, from the network nodes that have not previously served as a present FROM node, a network node to serve temporarily as a present FROM node such that each network node is sequentially selected to serve as a present FROM node;

c. selecting, each time a selection is made in carrying out steps (a) and (b), a network node, from the group containing the then present FROM node, to serve temporarily as a then present TO node such that as to each group network nodes thereof are sequentially selected to serve as TO nodes in the same order that they are sequentially selected to serve as FROM nodes; and d. verifying, each time that two different nodes are selected respectively as a present FROM node and as a present TO node, that continuity exists therebetween.

* * * * *